United States Patent [19]

Dannhäuser et al.

[11] 4,362,766
[45] Dec. 7, 1982

[54] METHOD FOR PREPARING A PROTECTIVE AMORPHOUS SILICON PASSIVATING FILM ON A SEMICONDUCTOR DEVICE

[75] Inventors: Friedrich Dannhäuser; Karl Kempter, both of Munich; Jürgen Krausse, Baldham; Manfred Schnöller, Halmhausen, all of Fed. Rep. of Germany

[73] Assignee: Siemens Aktiengesellschaft, Munich, Fed. Rep. of Germany

[21] Appl. No.: 279,345

[22] Filed: Jul. 1, 1981

[30] Foreign Application Priority Data

Aug. 23, 1978 [DE] Fed. Rep. of Germany ....... 2836911

[51] Int. Cl.³ .......................................... H01L 21/314
[52] U.S. Cl. ....................................... 427/39; 357/52; 427/85; 427/86; 427/95
[58] Field of Search ....................... 427/39, 86, 85, 95; 357/2, 52

[56] References Cited

U.S. PATENT DOCUMENTS

| | | | |
|---|---|---|---|
| 3,473,959 | 10/1969 | Ehinger et al. | 427/39 |
| 3,798,062 | 3/1974 | Maoczeck et al. | 427/39 |
| 4,064,521 | 12/1977 | Carlson | 357/2 |
| 4,066,037 | 1/1978 | Jacob | 427/39 |
| 4,069,492 | 1/1978 | Pankove et al. | 357/2 |
| 4,084,986 | 4/1978 | Aoki et al. | 357/52 |
| 4,134,125 | 1/1979 | Adams et al. | 357/52 |
| 4,142,195 | 2/1979 | Carlson et al. | 357/2 |
| 4,151,058 | 4/1979 | Kaplan et al. | 427/39 |
| 4,176,372 | 11/1979 | Matsushita et al. | 357/52 |
| 4,177,473 | 12/1979 | Ovshinsky | 357/2 |
| 4,177,474 | 12/1979 | Ovshinsky | 357/2 |
| 4,226,898 | 10/1980 | Ovshinsky | 427/39 |
| 4,289,797 | 9/1981 | Akselrad | 427/39 |

FOREIGN PATENT DOCUMENTS 48-2831 1/1973 Japan .................................... 427/86

OTHER PUBLICATIONS

Brodsky et al., "Hydrogenation and Doping of Amorphous GaAs...", IBM TDB 20, No. 11B, Apr. 1, 1978.
Spear et al., "Amorphous Silicon p-n Junction", Applied Physics Letters, 28, No. 2, Jan. 1976, p. 105.
Spear et al., "Substitutional Doping of Amorphous Silicon", Solid State Communications, 17, pp. 1193-1196, 1975.
Fuhs et al., "Heterojunctions of Amorphous Silicon...", Int. Conf. on Tetrahedral Bonded Amorphous Semiconductors, Yorktown Ht, NJ., Mar. 20, 1974.

Primary Examiner—John D. Smith
Attorney, Agent, or Firm—Herbert L. Lerner

[57] ABSTRACT

In the present invention a process is provided for depositing a protective passivating film of doped or undoped amorphous silicon on a body of semiconductor material. In the process a body of semiconductor material is disposed within a reaction vessel, a silicon-hydrogen gaseous compound is fed into the reaction vessel and decomposed by means of a glow discharge. The decomposition of the silicon-hydrogen gas mixture results in the deposition of amorphous silicon on the semiconductor body.

8 Claims, 2 Drawing Figures

METHOD FOR PREPARING A PROTECTIVE AMORPHOUS SILICON PASSIVATING FILM ON A SEMICONDUCTOR DEVICE

CROSS REFERENCE TO RELATED APPLICATION

This application is a continuation of our prior application, Ser. No. 066,369, filed Aug. 14, 1979 now abandoned.

BACKGROUND OF THE INVENTION

1. Field of the Invention

The present invention is generally concerned with semiconductor devices and specifically is concerned with a process for the passivation of semiconductor devices with amorphous silicon.

2. Description of the Prior Art

The purpose of applying a passivating film of an amorphous silicon to a semiconductor device is to ensure the uniformity of the current-voltage characteristic of the semiconductor device. With rectifiers and transistors, this is important, especially the current-voltage characteristic in the blocking direction, whereas, in the ease of thyristors, both the stability of the characteristic in the blocking direction and the stability of the characteristic in the forward (breakthrough) direction are important.

In prior art practice, a passivating film of amorphous silicon is vapor-deposited in vacuum, at least in the vicinity of the p-n junction.

Because of the linear spread of the vapor molecules when vapor-depositing in a high vacuum, a passivating film thickness is obtained which is a cosine function of the angle between the normal to the surface of the body of semiconductor material and the direction of the vapor beam. Thus, in order to obtain a relatively uniform coating on uneven surfaces and edges, the body of semiconductor material must be rotated around at least two axes with respect to the vapor stream during the vapor-deposition operation. Such rotation motion generally being obtained by means of a planetary gear system or the like.

The movement of the body of semiconductor material, during the vapor deposition operation, is also necessary in order to prevent the so-called shading effect which, arises during the build-up of the film. There also is a tendency for directional growth, columnar growth, and a material structure which is not completely dense. The latter, especially must be prevented where the film is to be used for passivation.

The present invention provides a process for depositing an amorphous silicon passivating film or layer on a body of semiconductor material. The layer or film has a uniform thickness, is fully dense, isotropic and stable.

SUMMARY OF THE INVENTION

The present invention provides a process for depositing a passivating film of amorphous silicon on at least a predetermined portion of a body of semiconductor material, comprising; disposing a body of semiconductor material within a reaction chamber, introducing a gaseous silicon-hydrogen compound into said chamber, and decomposing the silicon-hydrogen gaseous compound by means of a glow discharge, whereby, amorphous silicon is deposited upon at least predetermined portions of the body of semiconductor material.

BRIEF DESCRIPTION OF THE DRAWINGS

For a better understanding of the present invention, reference should be had to the following detailed discussion and drawing in which.

DESCRIPTION OF PREFERRED EMBODIMENTS

Figure 1:
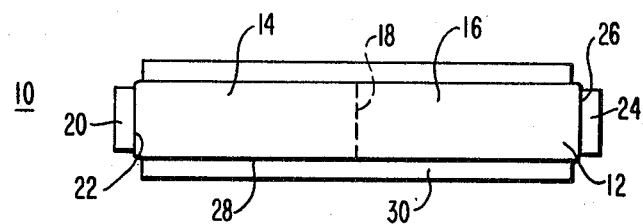
FIG. 1 is a side view in cross-section of a semiconductor device provided with a passivating film in accordance with the teachings of this invention.

With reference to FIG. 1, there is shown a semiconductor device 10. The device 10 consists of a body 12 of semiconductor material as for example silicon. The body 12 consists of a first region 14, of a first conductivity type, and a second region 16, of a second conductivity type. There is a p-n junction 18 between regions 14 and 16. The p-n junction 18 extends to rim surface 28 of the body 12.

A first metallic electrode 20 is affixed to surface 22 of region 14 and a second metallic electrode 24 is affixed to surface 26 of region 16.

Rim surface 28 of the body 12, extending between surfaces 22 and 26 of body 12, is provided with a passivating layer or film 30 consisting of amorphous silicon deposited by a glow discharge. The passivating film 30 can vary in thickness from about 0.05 $\mu$m to up to 2 $\mu$m in thickness. The lower range of thickness being especially suitable for integrated circuits.

It has been found that the amorphous silicon film 30 is especially suitable as a passivating film when its specific resistance lies between $10^8$ and $10^{10}$ ohm.cm. This specific resistance is determined by the hydrogen content of the amorphous silicon. In general, the greater the hydrogen content, the higher the specific resistance. An even higher specific resistance is recommended for high blocking voltage semiconductor devices, as, for example, up to $5 \cdot 10^{11}$ ohm.cm. This increase in resistance can be achieved by the addition of doping agents such as boron or carbon to the amorphous silicon film.

Figure 2:
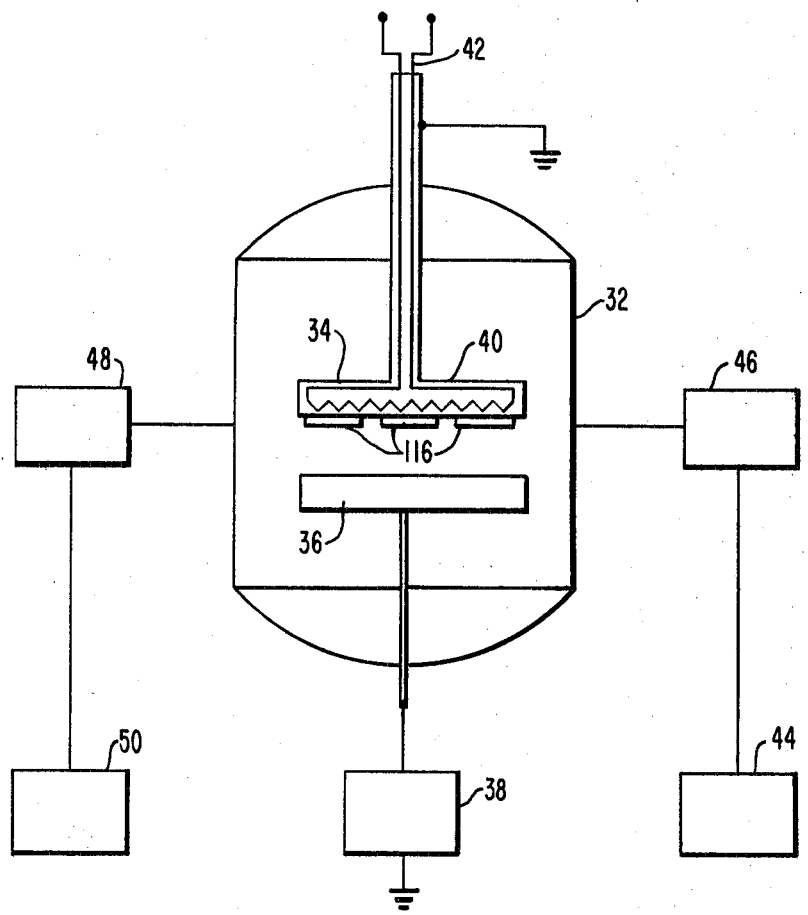
FIG. 2 is a schematic diagram of apparatus used in practicing the teaching of this invention.

With reference to FIG. 2, there is shown a reaction vessel or chamber 32. Two electrodes 34 and 36 are mounted in the reaction vessel or chamber 32 and electrically connected to output terminals of a voltage generator 38.

Bodies 116 of semiconductor material are attached to the electrode 34. The semiconductor bodies 116 can contain one, two or more p-n junctions or they can consist of integrated circuits. Electrode 34 is provided with a heater 40 which is connected via the leads 42 to a power supply not shown. The semiconductor bodies 116 are heated by means of the heater 40. The semiconductor bodies 116 can also be attached to the electrode 36 which can also be heated in the same manner as electrode 34 is heated.

The vessel or chamber 32 is connected to a pumping stand 44 to which is connected, in series, a particle precipitator 46. In addition, the vessel or chamber 32 is connected via a pressure regulator 48 to a gas supply 50. The gas supply 50 provides a silicon-hydrogen compound such as for example silane $SiH_4$, and a carrier gas such as argon. The silicon-hydrogen compound can be admixed with a suitable doping agent in gaseous form in the supply tank 50.

Prior to starting the actual precipitation or deposition process, the vessel or chamber 32 is evacuated by the pumping stand 44 and a silane pressure of 0.01 mbars to 2 mbars, and preferably 0.2 to 0.6 mbars is produced. The semiconductor bodies 116 are then heated to a temperature which lies between room temperature (about 18° C.) and 350° C. and preferably, to a temperature in the range of 150° C. and 250° C. By applying an electrical voltage between the electrodes 34 and 36, a glow discharge is produced, whereby, the surface of the semiconductor bodies is subjected to a loading of up to 1 W/cm$^2$. The applied voltage can be a dc voltage, a low frequency or a high frequency ac voltage with a frequency of up to 27 MHz, for example. Under the stated conditions, an amorphous film of silicon containing 5 to 40 atomic percent of hydrogen is deposited on the surface of the semiconductor bodies 116. When the glow discharge is maintained for ten or more minutes, a passivating film of at least 0.1 $\mu$ms in thickness will be deposited on the semiconductor bodies. As a result of the hydrogen, a saturation of electronic states "sets-in" in the amorphous silicon. This, on the one hand, leads to a stabilization of the electrical resistance with respect to external influences and, on the other hand, due to the adjustable amount of the incorporated hydrogen, to a value of the specific electrical resistance of $10^8$ ohm.cm to $10^{10}$ ohm.cm, which is taken as optimum for passivation.

The hydrogen content, which is of importance for the magnitude and stability of the specific resistance of the passivating film, can be adjusted by changes in the following parameters; silane pressure, silane flow-rate, power in the glow discharge and temperature of the semiconductor bodies. In order to set the specific resistance to an even higher value, a doping gas can be added along with the silane to the plasma in the chamber or vessel 32. Thus, it is possible, in a simple manner, to adjust the specific electrical resistance to the very high values of $10^9$ ohm cm to $10^{11}$ ohm.cm by doping or modifying the chemical composition of the amorphous silicon. By this means, the electrical shunt which occurs at the p-n junction can, if need be, be very effectively reduced. An admixture of $10^{-4}$ to $10^{-2}$ volume percent of diborane ($B_2H_6$) to the silicon-containing reaction gas raises the specific electrical resistance to as high as $5 \cdot 10^{11}$ ohm cm. If the reaction gas silane is mixed with from 10% to 60% and preferably approximately 50%, by volume ethylene ($C_2H_4$), an amorphous material similar to silicon carbide is obtained whose specific resistance likewise lies between $10^{10}$ and $10^{11}$ ohm.cm.

A particular technical advantage of the proposed procedure lies in the relatively low temperature of about 200° C. necessary to carry out the reaction. The energy required to decompose the silane-containing reaction gas is provided by the glow discharge plasma and does not require the high temperature necessary in the so-called CVD (chemical vapor deposition) process. As a result of the incorporation of hydrogen and, if need be, the incorporation of a doping agent, the amorphous silicon film attains, as a result of the deposition, the necessary density of electron states distribution and thus the optimum specific electrical resistance, so that a subsequent heat treatment, as is required in the vapor deposition process, is superfluous in the presently proposed process.

By employing the above-described process, passivating films on semiconductor devices are obtained which display outstanding adhesion to the semiconductor material and complete stability with respect to moisture. Inappreciable changes in the specific resistance occur after a heat treatment at temperature up to 500° C. as is necessary in many of the subsequent treatment stages of the semiconductor device.

It is additionally of decisive importance, as far as technological applications are concerned, that the hydrogen-containing amorphous silicon films can be etched by conventional means, as, for example, by a caustic potash solution.

The following is a specific example of parameters used in practicing the present invention.

EXAMPLE

Reaction gas—SiH$_4$
Gas pressure—0.22 mbar
Flow-rate—10 mMoles/h with a 10 filter reactor volume
Semiconductor body temperature 230° C.
Glow discharge power per unit area of electrode 7 mW/cm$^2$
Reaction time 20 min
film thickness 0.2 $\mu$m
Hydrogen content 15%
Specific resistance 1.2 $10^9$ ohm cm.

With essentially the same conditions, but with a substrate temperature of 250° C., and a hydrogen content of 11% a specific resistance of $5 \cdot 10^8$ ohm.cm was obtained.

While the presently preferred embodiments of the present invention have been specifically described, it is to be understood that the invention may be modified and still be within the scope of the following claims.

We claim as our invention:

1. Process for depositing a passivating film of amorphous silicon on a body of silicon semiconductor material, comprising disposing a a semiconductor body in a glow discharge path within a reaction chamber maintained under vacuum, conducting a flow of gaseous silicon-hydrogen compound into said reaction chamber to effect decomposition of the compound by the glow discharge energized by voltage from an external source of electrical power and deposition of a passivating film of amorphous silicon on the semiconductor body maintained in the range of 150° to 350° C., and regulating the operating conditions in the reaction chamber, namely, gaseous silicon-hydrogen pressure, flow rate of gaseous silicon-hydrogen, power in the glow discharge and temperature of the semiconductor body to obtain a content of hydrogen in the amorphous silicon between 5 and 40 atom-percent and a resistivity between $10^8$ and $10^{10}$ ohm/cm.

2. The process of claim 1 in which the gaseous silicon-hydrogeen compound is hydrogen silane (SiH$_4$).

3. The process of claim 2 in which the body of semiconductor material is heated to a temperature in the range of from 150° C. to 250° C. before the hydrogen silane is decomposed by the glow discharge.

4. The process of claim 2 in which a silane pressure of from 0.01 mbar to 2.0 mbar is established within the reaction chamber.

5. The process of claim 2 in which a silane pressure of from 0.2 mbar to 0.6 mbar is established within the reaction chamber.

6. The process of claim 3 in which a silane pressure of from 0.2 to 0.6 mbar is established within the reaction chamber.

7. Process for depositing a passivating film of amorphous silicon on a body of silicon semiconductor material, comprising disposing a semiconductor body in a glow discharge path within a reaction chamber maintained under vacuum, conducting a flow of gaseous hydrogen silane (SiH$_4$) into said reaction chamber to effect decomposition of the hydrogen silane by the glow discharge energized by voltage from an external source of electrical power and deposition of a passivating film of amorphous silicon on the semiconductor body maintained in the range of 150° to 350° C., and regulating the operating conditions in the reaction chamber, namely, gaseous hydrogen silane pressure, flow rate of gaseous hydrogen silane, power in the glow discharge and temperature of the semiconductor body to obtain a content of hydrogen in the amorphous silicon between 5 and 40 atom-percent in which $1\times10^{-4}$ to $1\times10^{-2}$, volume percent, of diborane (B$_2$H$_6$) is mixed with the hydrogen silane to obtain a resistivity between $10^9$ and $5\times10^{11}$ ohm/cm.

8. Process for depositing a passivating film of amorphous silicon on a body of silicon semiconductor material, comprising disposing a semiconductor body in a glow discharge path within a reaction chamber maintained under vacuum, conducting a flow of gaseous hydrogen silane (SiH$_4$) into said reaction chamber to effect decomposition of the hydrogen silane by the glow discharge energized by voltage from an external source of electrical power and deposition of a passivating film of amorphous silicon on the semiconductor body maintained in the range of 150° to 350° C., and regulating the operating conditions in the reaction chamber, namely, gaseous hydrogen silane pressure, flow rate of gaseous hydrogen silane, power in the glow discharge and temperature of the semiconductor body to obtain a content of hydrogen in the amorphous silicon between 5 and 40 atom-percent in which 10% to 60%, by volume, of ethylene (C$_2$H$_4$) is mixed with the hydrogen silane to obtain a resistivity between $10^{10}$ and $10^{11}$ ohm/cm.

* * * * *